United States Patent [19]
Morton

[11] Patent Number: 5,887,435
[45] Date of Patent: Mar. 30, 1999

[54] ENVIRONMENTALLY PROTECTED MODULE

[75] Inventor: James R. Morton, Valencia, Calif.

[73] Assignee: Litton Systems, Inc., Woodland Hills, Calif.

[21] Appl. No.: 762,663

[22] Filed: Dec. 9, 1996

Related U.S. Application Data

[60] Provisional application No. 60/008,392 Dec. 8, 1995.

[51] Int. Cl.$^6$ .................................................. F25B 21/02

[52] U.S. Cl. .......................... 62/3.6; 62/259.2; 361/713; 361/714; 361/688; 174/52.2

[58] Field of Search ................................. 62/3.2, 3.3, 3.6, 62/259.2; 361/676, 678, 688, 690, 694, 695, 696, 697, 704, 705, 706, 709, 710, 711, 713, 714, 722, 720; 174/52.2

[56] References Cited

U.S. PATENT DOCUMENTS

| | | | |
|---|---|---|---|
| 3,488,970 | 1/1970 | Hallenburg | 62/3.2 |
| 5,075,555 | 12/1991 | Woldseth et al. | 62/3.2 |
| 5,197,291 | 3/1993 | Levinson | 62/3.7 |

*Primary Examiner*—John M. Sollecito
*Attorney, Agent, or Firm*—Lewis B. Sternfels; Gerald L. Cline

[57] ABSTRACT

The environmentally protected module (16, 116, 216), which is qualifiable under military and space specifications, uses commercial and/or industrial grade electronic components (18, 20; 118, 120; 218, 220). The components are secured to and are electrically coupled together on a printed wiring board (24, 124, 224), through which thermally conductive vias (38, 138, 238) extend. The components are encapsulated in a thermally conductive and electrically insulative packaging material (25a, 25b; 125; 225, 229). Cooling or heating is provided by Peltier thermoelectric heat pump devices (32, 132, 232) coupled between an external heat sink/exchanger (35, 80; 135; 235) and the components.

19 Claims, 11 Drawing Sheets

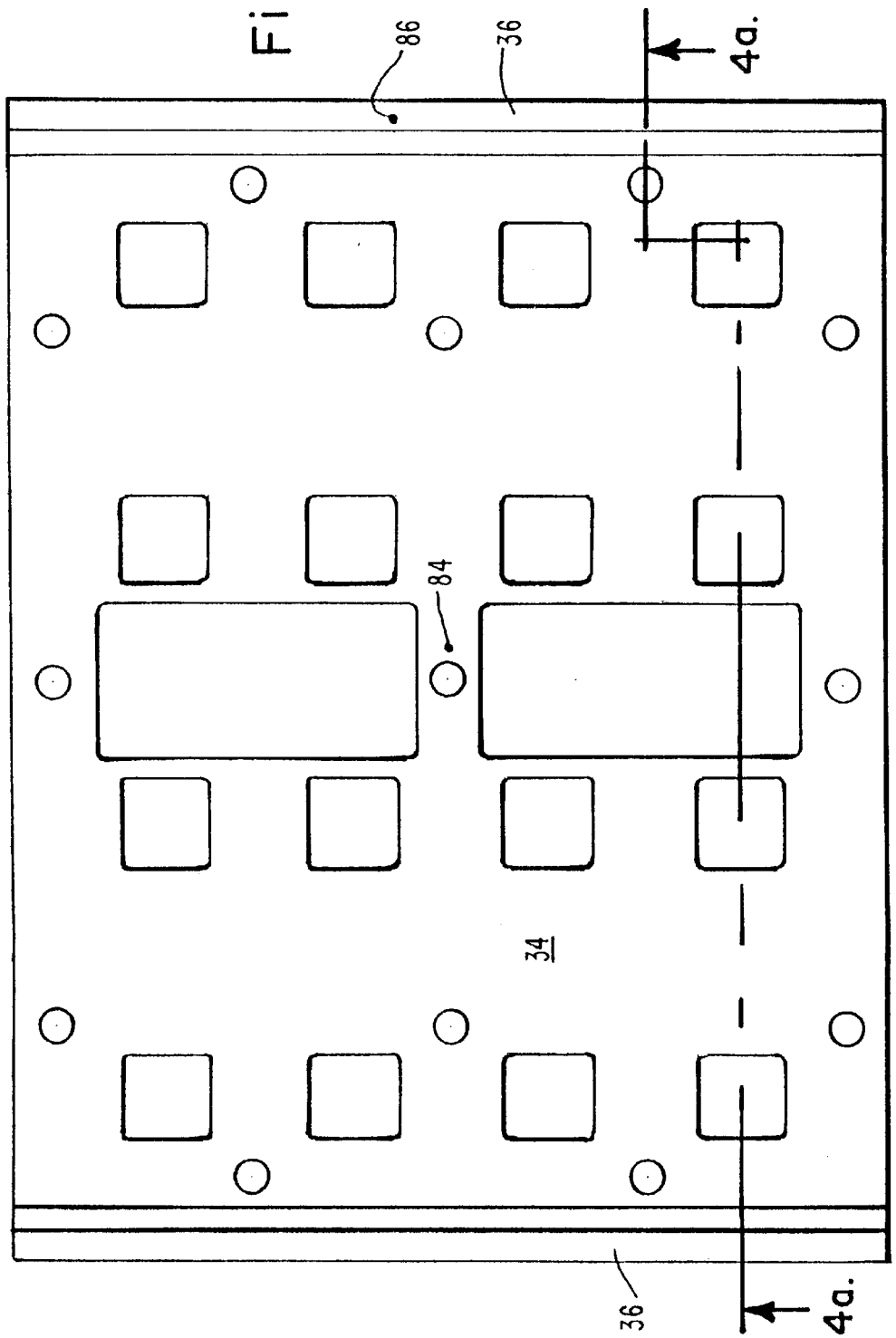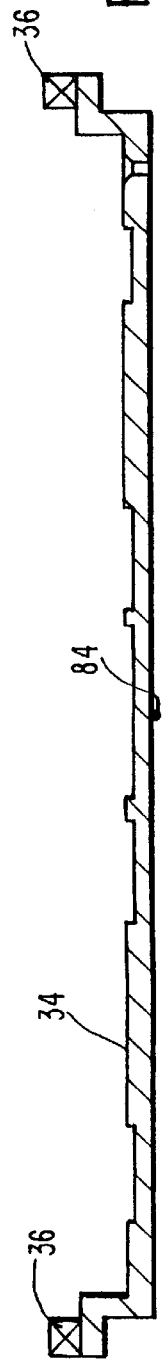

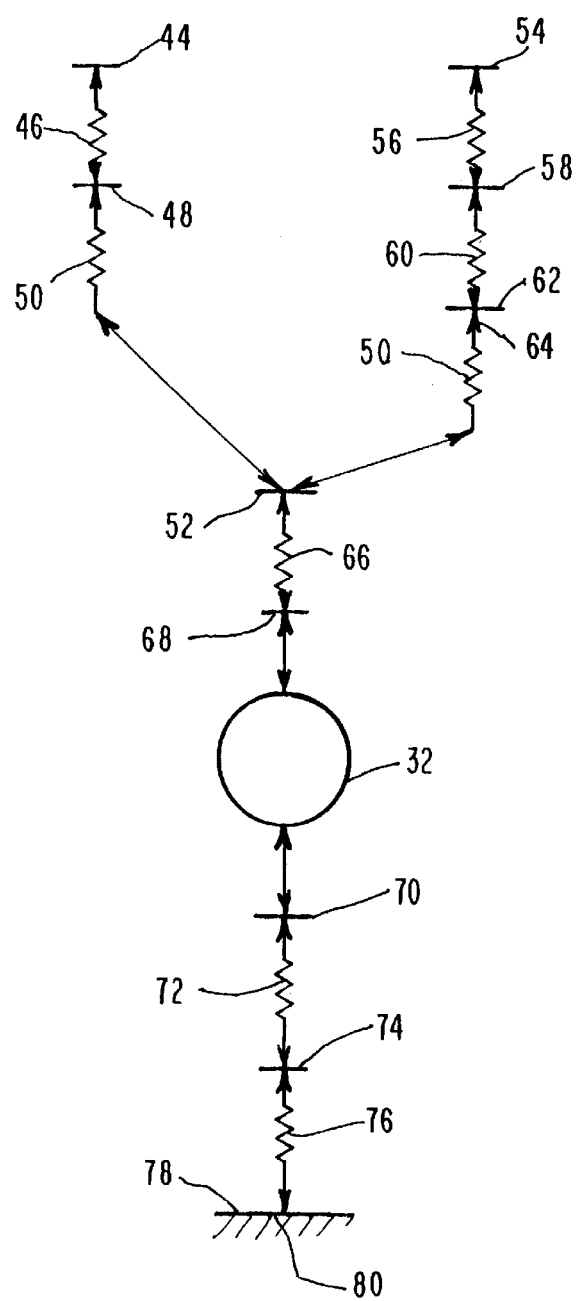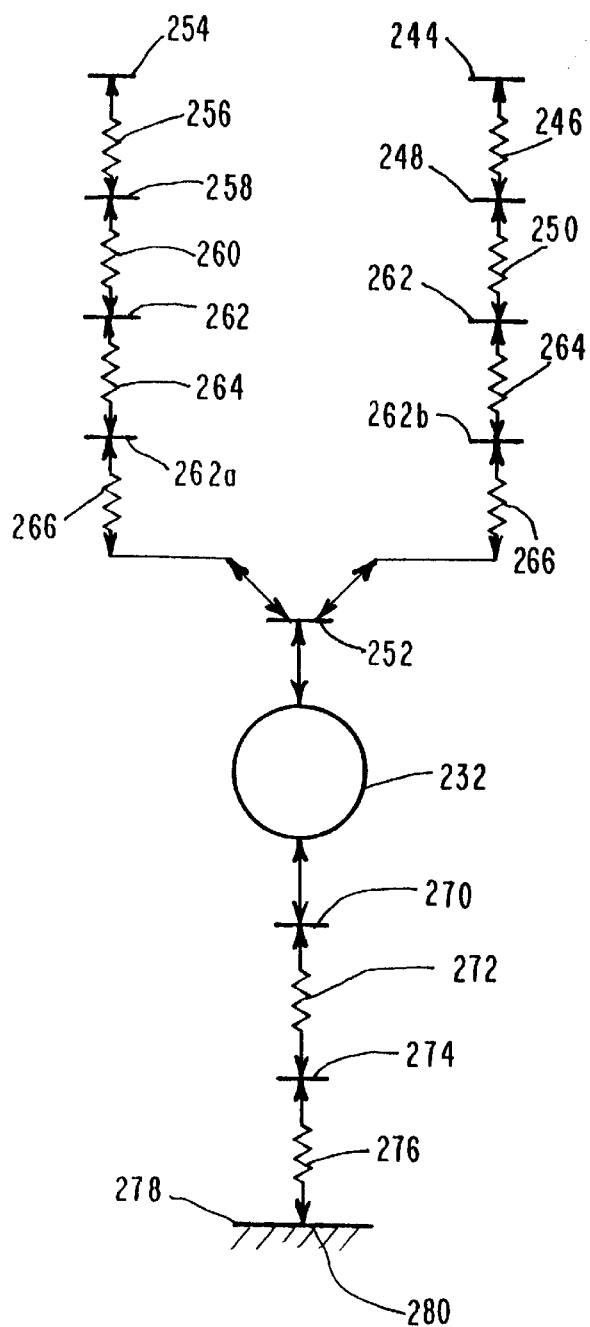
Fig. 5.
Fig. 10.

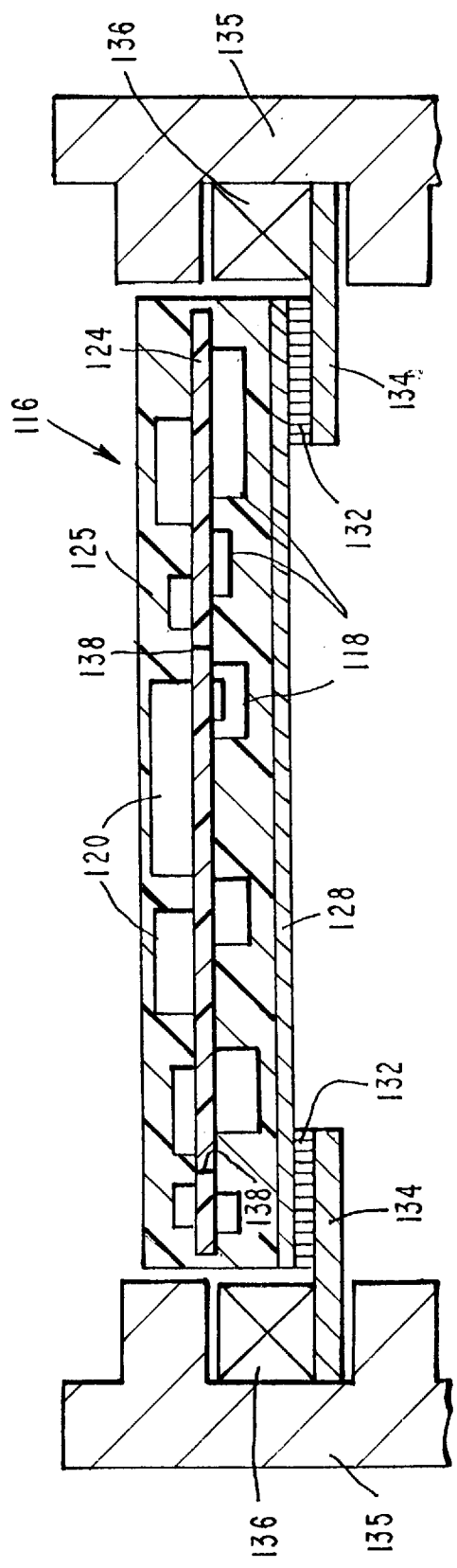
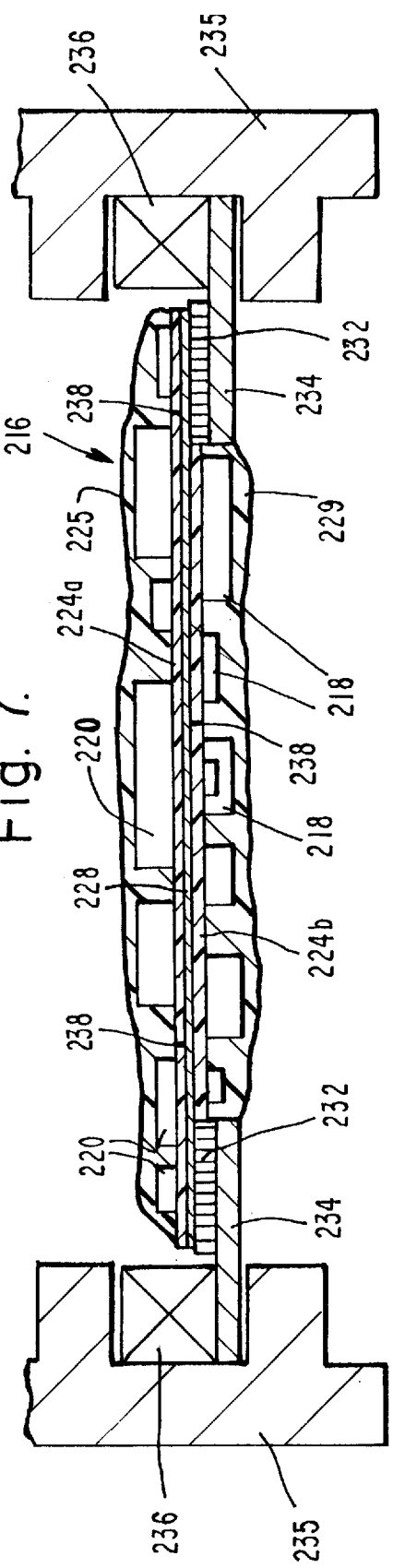
Fig. 6.
Fig. 7.

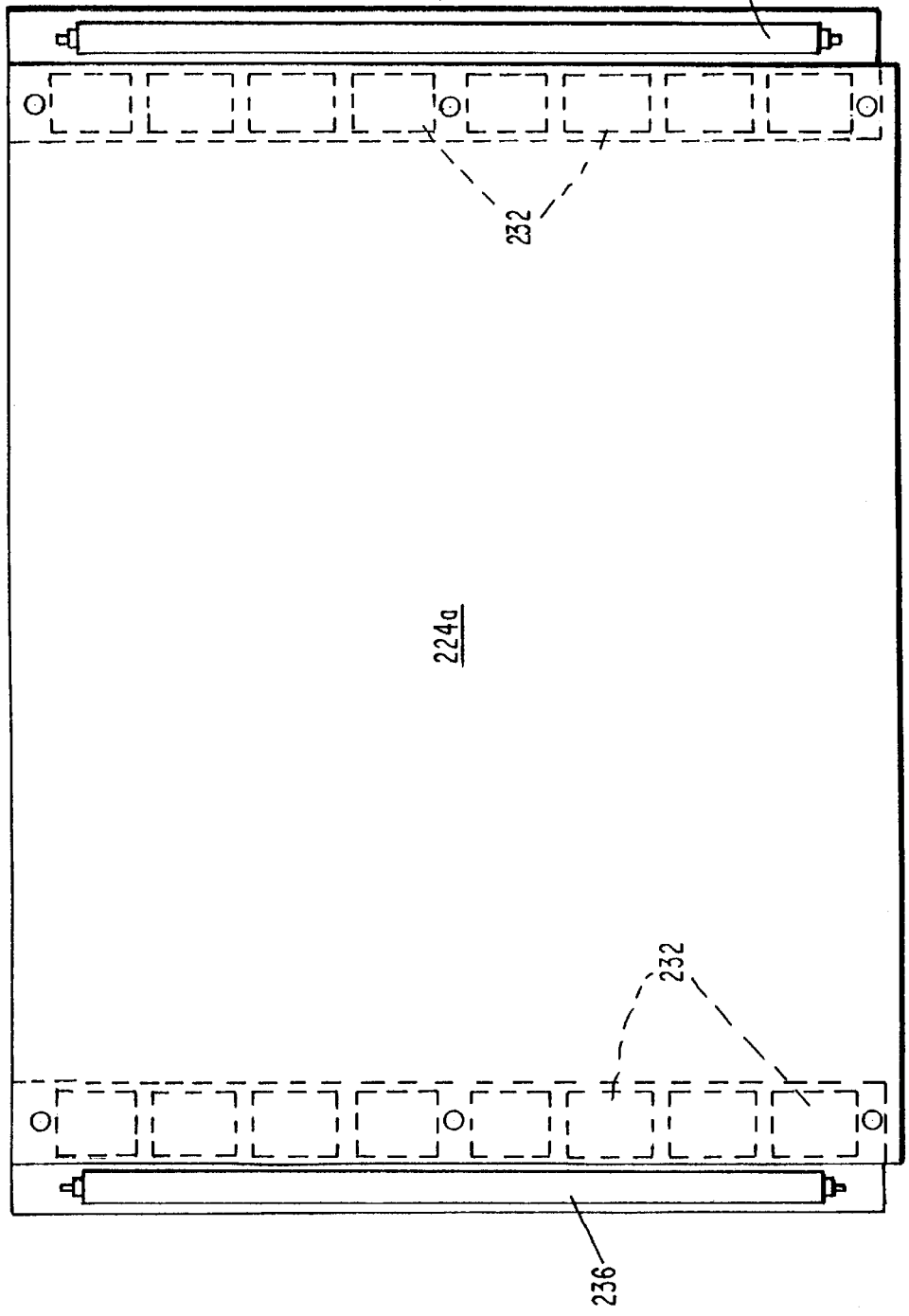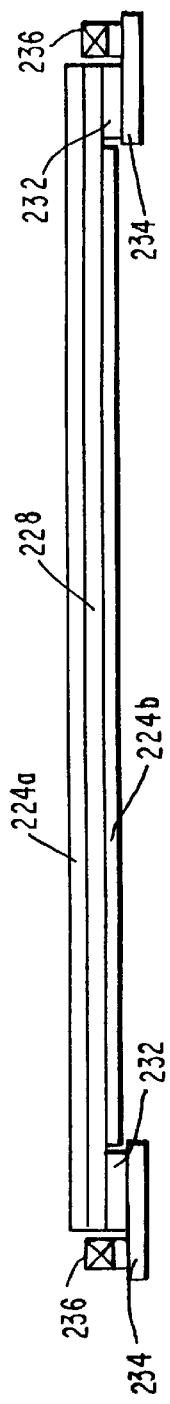

ENVIRONMENTALLY PROTECTED MODULE

CROSS-REFERENCE TO RELATED APPLICATION

This application claims the benefit of U.S. Provisional Application No. 60/008,392 filed 08 Dec. 1995.

BACKGROUND OF THE INVENTION

1. Field of the Invention

The present invention relates to electronic modules and, in particular, to such modules using commercial grade components which are protected from heat, cold and other environmental degradation, to the extent of being qualifiable under military specifications.

2. Description of Related Art and Other Considerations

Militarily and space qualified electronic components, e.g., chips in ceramic packages, are used in such modules as computer processing units (CPU's). Military specifications require such components to have a case temperature which is rated from −50° C. to 125° C., with a maximum junction temperature of 150° C. or more.

Commercial and industrial rated plastic encapsulated parts have a maximum junction temperature ranging from +85 to +115° C., because the die and encapsulant used in these parts have radically different coefficients of thermal expansion. Commercial parts are not rated below 0° C., and industrial only parts to −40° C. The market for militarily qualified parts with the performance of those found, for example, in common desk top personal computers has not been reason enough for manufacturers to produce these parts. Therefore, commercial and industrial grade components are not currently qualified for military applications.

However, commercial and industrial components are considerably cheaper than their functionally corresponding military components. For this reason, it would be most desirable if commercially rated RISC and other microprocessors and other highly integrated plastic packaged chips could be used in a high performance computer processing unit design for military applications.

In addition, such components must be cooled and/or heated. For military and space use, it is essential that the components and the equipment in which they are used weigh as little as possible and be compactly packaged. Thus, fans and like cooling apparatus employed in commercial and industrial applications are not suitable for such use.

SUMMARY OF THE INVENTION

These and other problems are successfully addressed and overcome by the present invention. Commercial and industrial components in an environmentally secure package and thermally coupled to heating and cooling elements are combined with a very good thermal design, such as a low power computer processing unit design. The heating and cooling elements, which include thermoelectric heat pumps, commonly known as Peltier thermoelectric heat pumps, are coupled to an external heat exchanger. A suitable secure environment is provided by encapsulation.

Several advantages are derived from this arrangement. Commercial and industrial components can now be substituted, and be the functional equivalents for military and space qualified components. The cost of the systems in which they can be used is substantially reduced vis-a-vis currently qualified parts, without increased weight. Although protected from the environment, such as by encapsulation or other encasement, they can be heated and cooled, as needed, in a compact package. The active heatsink makes it possible to use available high performance commercial parts reliably with no temperature prescreening. The Peltier pumps provide a controlled environment that buffers the temperature extremes seen by the commercial plastic encapsulated die. At temperatures below 20° C., the Peltier units pump heat into the electronics module. At temperatures above +40° C. the Peltier units pump heat out of the electronics module.

Other aims and advantages, as well as a more complete understanding of the present invention, will appear from the following explanation of exemplary embodiments and the accompanying drawings thereof.

BRIEF DESCRIPTION OF THE DRAWINGS

FIG. 4 depicts the top view of an inner part, the main heat sink, of the module shown in FIGS. 1–3.

FIG. 4a is a cross-sectional view of FIG. 4 taken along line 4a—4a thereof.

FIG. 5 is a diagram of the heat flow from the heat generating electronic devices shown in FIG. 3, in which the dashed line paths therein are reproduced as heat flow lines with thermal resistances represented as resistor symbols.

FIG. 6 is a view of a second embodiment of the present invention.

FIG. 7 is a view of a third embodiment of the present invention.

FIG. 8 is a top view of the module shown in FIG. 7.

FIG. 8a is a side view of FIG. 8.

FIG. 10 is a diagram of the heat flow from the heat generating electronic devices shown in FIG. 9, in which the dashed line paths therein are reproduced as heat flow lines with thermal resistances symbolized as resistors.

FIG. 11 shows the entire −50° C. to 100° C. range and FIGS. 12 and 13 are enlargements of the curves illustrated in FIG. 11 respectively for the −50° C. to 0° C. range and for the 0° C. to 100° C. range.

DETAILED DESCRIPTION OF THE PREFERRED EMBODIMENTS

Figure 1:
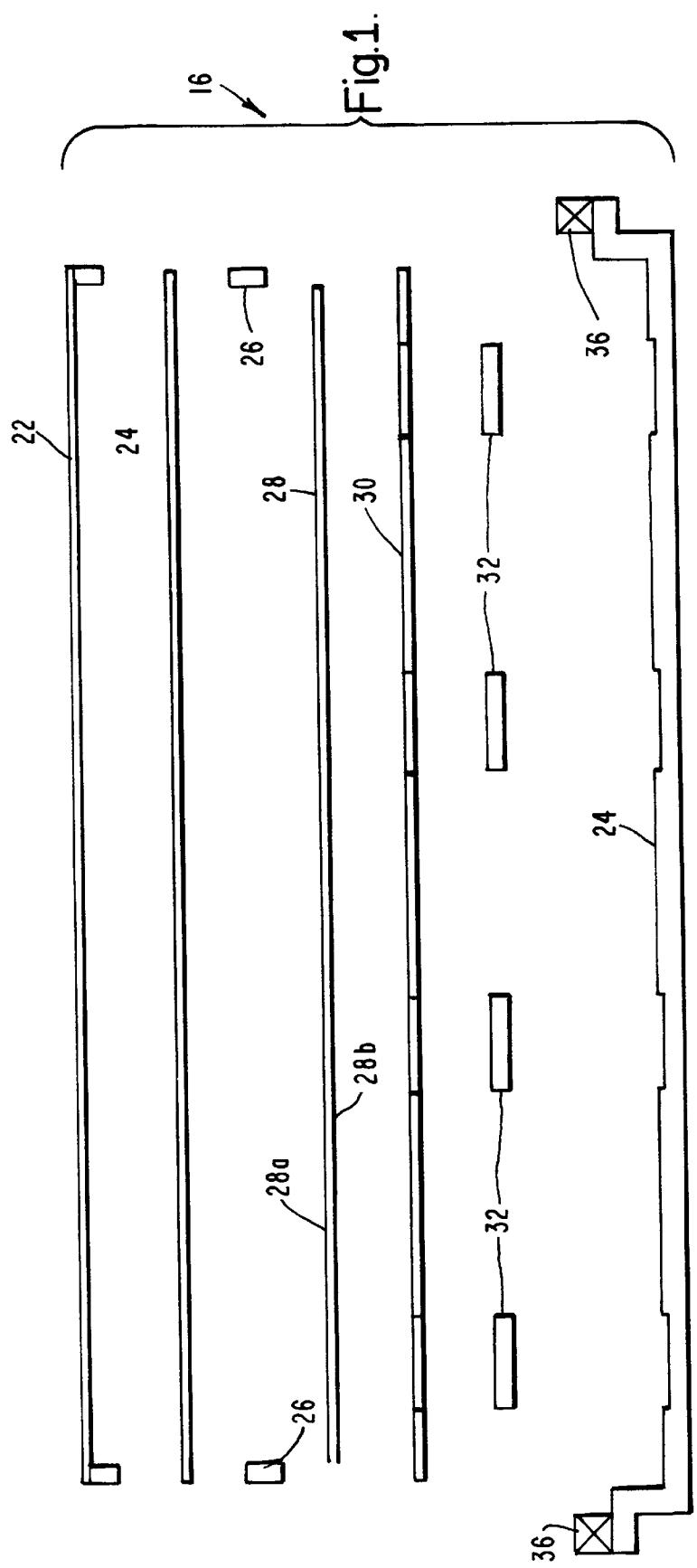
FIG. 1 is an exploded view of an electronic module configured according to a first embodiment of the present invention.
Figure 2:
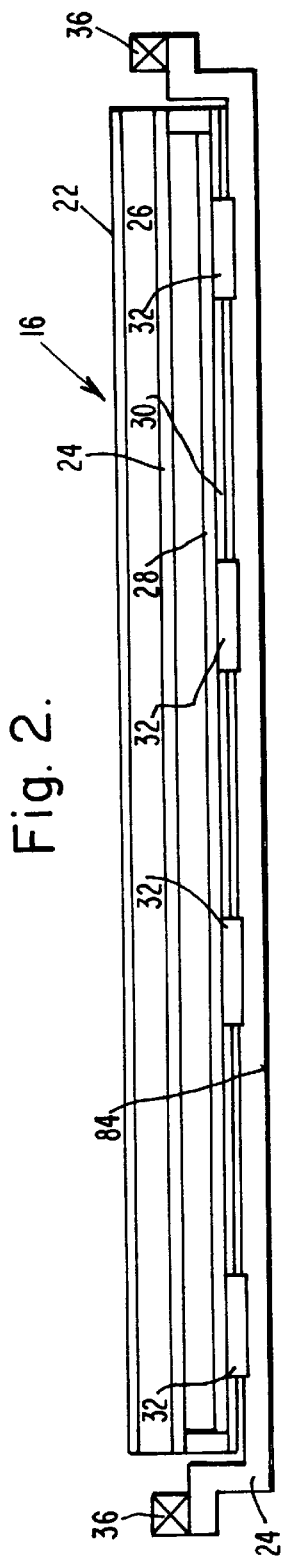
FIG. 2 is a view of an assembled module comprising the components depicted in FIG. 1.
Figure 3:
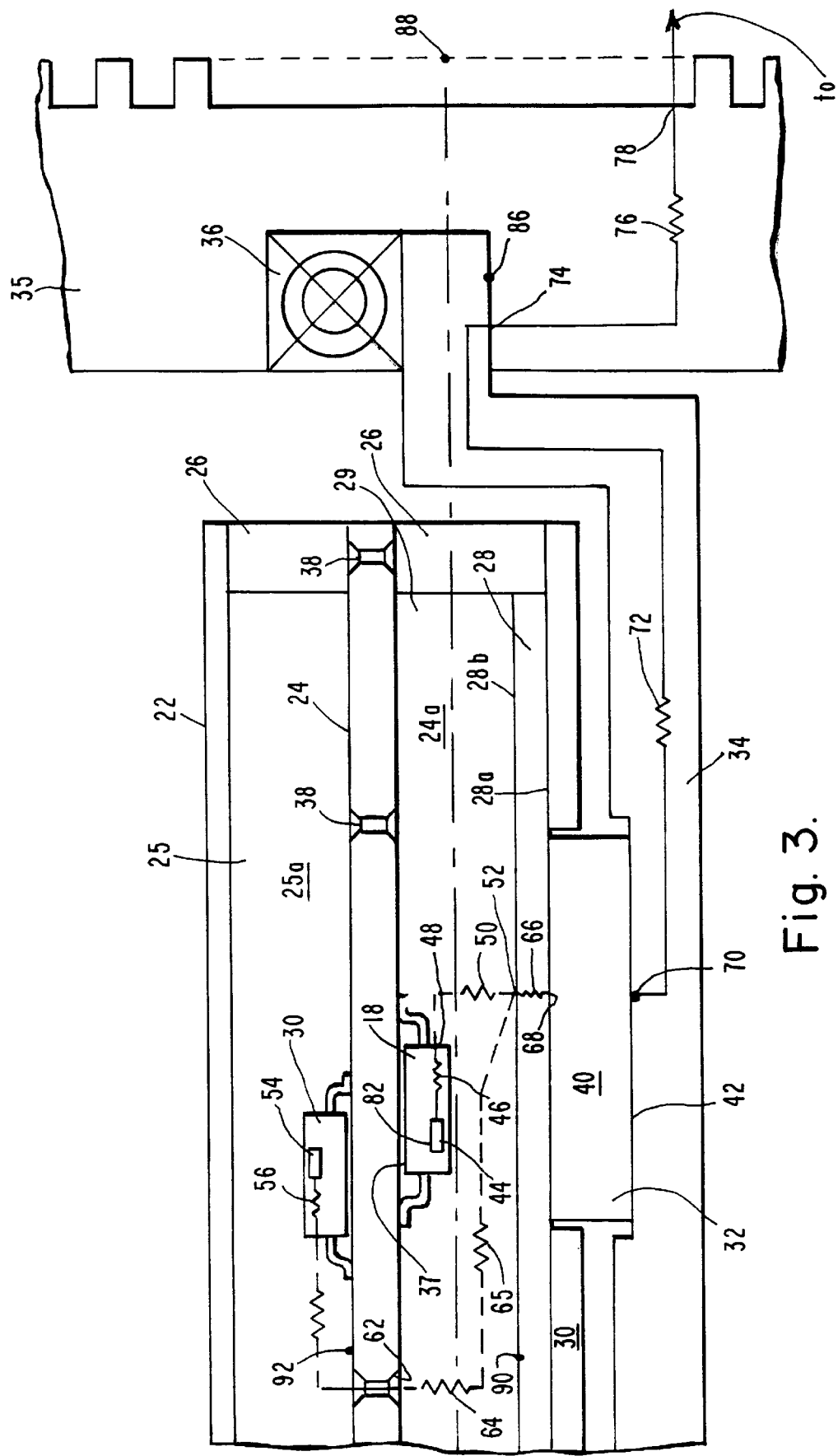
FIG. 3 is an enlarged section of a portion of the module illustrated in FIG. 2 and showing the paths, in dashed lines, of heat removal from sources thereof generated from electronic devices.

Referring to FIGS. 1–3, an environmentally protected module 16 is designed to enclose a plurality of electronic components 18 and 20 (see FIG. 3), which are also designated respectively as components "U1" and "U2" in the mathematical equations discussed below. Module 16 includes a cover 22, a printed wiring board (PWB) 24, sidewalls 26, a copper cold plate 28 having upper and lower surfaces 28a and 28b, a Peltier printed wiring board 30, an array of Peltier thermoelectric heat pumps 32, and a main heat sink 34. Heat sink 34 is supported by and secured to an exterior heat sink 35 by a wedge-lock 36 of conventional construction.

As best shown in FIG. 3, a plurality of electronic components, such as devices 18 (U1) and 20 (U2), are mechanically and electrically secured to printed wiring board 24. Devices 18 and 20 typically generate heat, which must be removed from environmentally protected module 16. One method of mechanically securing devices 18 and 20 to printed wiring board 24 is by a thermal compound 37.

Cover 22 is spaced from printed wiring board 24 to form an upper cavity 25 into which the electronic components, such as exemplified by device 20, are housed. In a like manner, printed wiring board 24 is spaced from cold plate 28 to form a lower cavity 29 into which the electronic components, such as exemplified by device 18, are housed. Potting compounds 25a and 29a or conformal coatings, which are thermally conductive but electrically insulative, are placed respectively over devices 18 and 20 to encapsulate them from environmental damage caused, for example, by moisture. The potting compounds may be inserted into cavities 25 and 29 by any means, such as through access holes in module 16.

A plurality of thermal vias or feed-throughs 38 of copper or other heat conductive material are positioned throughout printed wiring board 24 and extend therethrough to permit conductance of heat, as will be explained more thoroughly hereinafter.

Peltier thermoelectric heat pumps 32 are bonded at their upper surfaces 40 to cold plate 28 and secured to main heat sink 34 by a thermally conductive grease 42. The use of bonding and a thermal grease is conventional; the different attachments are provided for convenience because, in assembling environmentally protected module 16 together, heat pumps 32 are secured to one component first, by bonding, and then, when the components are placed together, it is easier simply to use a thermal grease or similar conductive medium as a thermal conductor.

The several components are of conventional design and of conventional material. For example, while printed wiring board 24 and Peltier printed wiring board 30 in FIG. 4 are denoted as being constructed of a glass epoxy, they may be formed of any other suitable material. Also, wall plate 28 and main heat sink 34 may be formed, for example, of copper, aluminum or a heat conductive graphite composition. It is a feature of the present invention that the number of Peltier heat pumps 32 be increased, so that they may be operated at low power levels and, therefore, more efficiently produce heating or cooling than if they were operated at higher power levels.

Heat is conducted to or from devices 18 and 20, specifically from their respective integrated circuits 44 and 54, as shown in FIGS. 3 and 5, by use of paths including symbols having the appearance of resistors. In the following description, "T" denotes temperature, "j" denotes junction, and "MAX" denotes maximum. This symbology is used below in the tables, equations and the like. The arrows in FIG. 5 indicate that heat flow can be from or into the module; heat flow out is represented by arrowheads directed downwardly in the figure, while heat flow into the module is represented by upwardly directed arrowheads. The following description relates to heat flow out of the module. Specifically, heat from device 18 (U1) is at its maximum at integrated circuit 44, denoted by $T_{jMAx-U1}$, and is conducted therefrom through matter in device 18, having a thermal resistance denoted by indicium 46, to a junction $T_{CASE-U1}$ (indicium 48) at the exterior or case of device 18. Thence, heat is conducted through potting material 29a in lower cavity 29, having a thermal resistance denoted by indicium 50, to a junction $T_{COPPER-UPPER-SURFACE}$ (denoted by indicium 52) at cold wall plate upper surface 28a.

In a similar manner, heat from device 20 (U2) is at its maximum at integrated circuit 54, denoted by $T_{jMAX-U2}$, and is conducted therefrom through matter internal to device 20, having a thermal resistance denoted by indicium 56, to a junction $T_{CASE-U2}$ (denoted by indicium 58) to the exterior or case of device 20. Thence, heat is conducted through potting compound 25a having a thermal resistance denoted by indicium 60 through one or more vias 38 in printed wiring board 24 to a junction $T_{PWB}$ (indicium 62). The thermal resistance of printed wiring board 24 is denoted by indicium 64. Heat energy is conducted therefrom through potting material 29a in lower cavity 29, having a thermal resistance denoted by indicium 50, to join the heat conductance path from device 20 at $T_{COPPER-UPPER-SURFACE}$ (denoted by indicium 52) at wall plate upper surface 28a.

From junction point 52 at $T_{COPPER-UPPER-SURFACE}$, heat is conducted through cold wall or plate 28 (denoted by thermal resistance 66) to a junction $T_{COPPER-LOWER-SURFACE}$ (denoted by indicium 68) at wall plate lower surface 28b. The heat is then fed into the array of Peltier thermoelectric heat pumps 32 which produce a temperature drop of about 20° C. to 30° C. Heat energy travels from heat pumps 32 to a junction $T_{PELTIER\ HOT}$ (indicium 70) and into and through main heat sink 34, having a thermal resistance denoted by indicium 72, for transfer to the exterior of environmentally protected module 16 through wedge-locks 36 at junction $T_{WEDGE}$ (indicium 74). Final rejection of heat from module 16 and its supporting structure is denoted by a passage through module supporting external heat sink 35, having a thermal resistance (indicium 76) and through a junction 78 to an external heat exchanger 80.

While heat pumps 32 have been described as functioning to extract heat from module 16 and its heat generating devices, such as devices 18 and 20, as stated above, they are also useful to inject heat in the module and its devices, should temperature conditions so require. Therefore, a discussion here on this condition would be similar to that above, but modified to indicate that devices 18 and 20 are at a minimum, rather than at a maximum heat. Accordingly, the external heat exchanger functions either as a heat sink for receiving heat from electronic components or devices 18 and 20, or for supplying heat to them.

FIG. 6 illustrates a second embodiment of the present invention, comprising a module 116. The module includes a plurality of electronic components 118 and 120 which are electrically and physically secured to a printed wiring board 124, and encapsulated in a potting compound or conformal coating 225. Like printed wiring board 24 of FIGS. 1–4, board 124 preferably includes a plurality of thermally conductive vias 138 although, because coating 125 is shown as completely surrounding the printed wiring board and the components, the use of vias 138 may not be necessary. However, for most efficient thermal conductivity, thermally conductive vias are employed. The printed wiring board and electronic component subassembly is secured to a cold plate 128 by any suitable means, such as by potting compound or conformal coating 225. The cold plate is secured to an array of Peltier thermoelectric heat pumps 132. Here, however, as distinguished from the embodiment shown in FIGS. 1–4, Peltier devices 132 are positioned at the edges of module 116, and secured to short heat sink supports 134. The heat sink supports are secured in good thermal contact with module supporting external heat sink 135 by wedge-locks 136.

Figure 9:
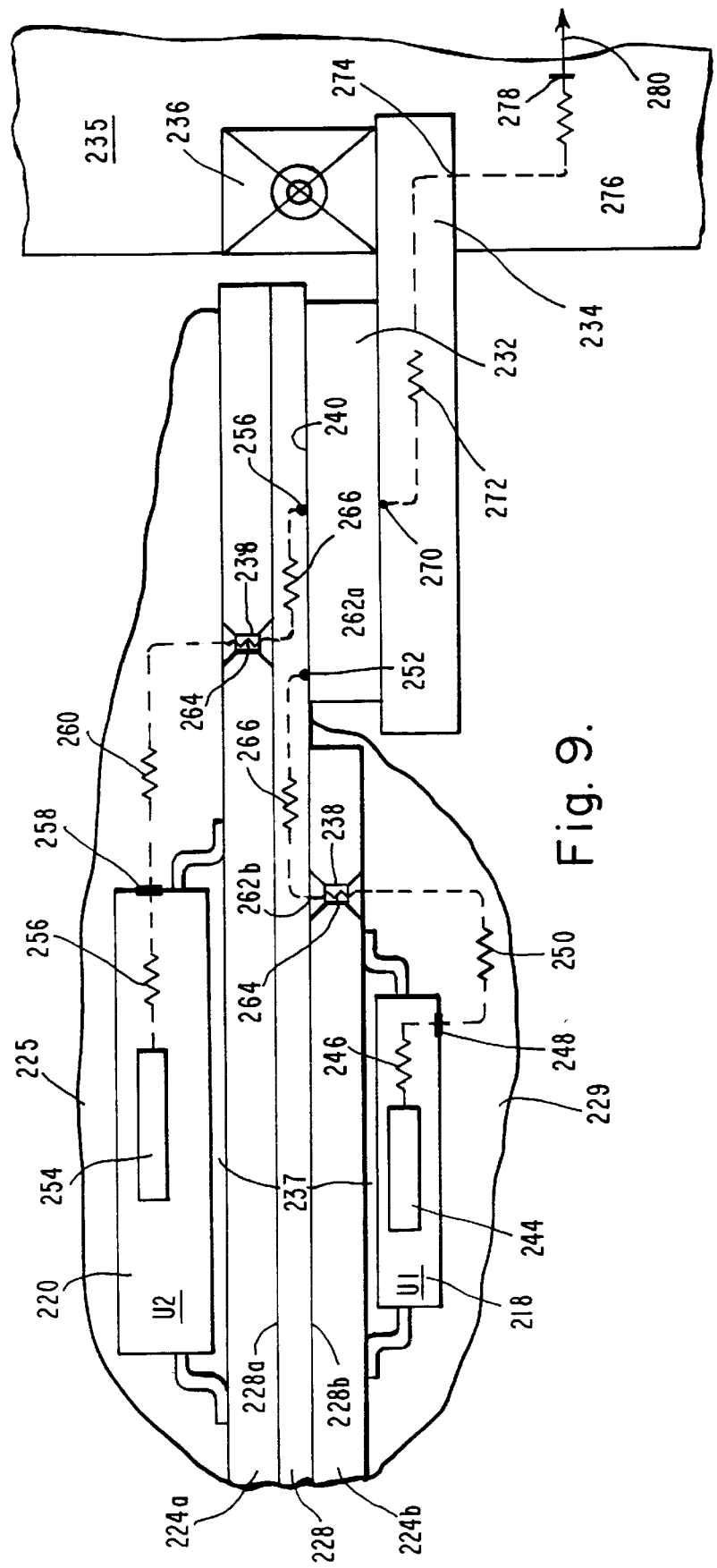
FIG. 9 is an enlarged section of a portion of the module illustrated in FIG. 7, and further shows, as dashed lines, the paths of heat removal from sources thereof generated from electronic devices.

Now referring to FIGS. 7–9, an environmentally protected module 216 is designed to enclose a plurality of electronic components 218 (U1) and 220 (U2) (see also FIG. 9). Module 216 includes a pair of printed wiring boards 224a and 224b positioned in a sandwich arrangement about a cold plate 228 at its upper and lower surfaces 228a and 228b. An array of Peltier thermoelectric heat pumps 232 are secured to main heat sinks 234 in a manner similarly shown in FIG. 6. Heat sinks 234 are supported by and secured to an exterior heat sink 235 by wedge-locks 236 of conventional construction.

As best shown in FIG. 9, electronic components or devices 218 (U1) and 220 (U2), are mechanically and electrically secured respectively to printed wiring boards 224a and 224b. Devices 218 and 220 typically generate heat, which must be removed from environmentally protected module 216. As described above, heat can be furnished to the devices. One method of mechanically securing devices 218 and 220 to printed wiring boards 224 is by a thermal compound 237.

As depicted in FIGS. 7 and 9, potting compounds or conformal coatings 225 and 229, which are thermally conductive but electrically insulative, are placed respectively over devices 218 and 220 and their respective printed wiring boards 224a and 224b respectively to encapsulate them from such environmental damage as moisture. The potting compounds may be applied by any conventional means.

A plurality of thermal vias or feed-throughs 238 of copper or other heat conductive material are positioned throughout printed wiring boards 224a and 224b and extend therethrough to permit conductance of heat, as will be explained more thoroughly hereinafter.

Peltier thermoelectric heat pumps 232 are bonded at their upper surfaces 240 to cold plate 228 and secured to main heat sink 234 by a thermally conductive grease 242.

The several components are of conventional design and of conventional material as described above with respect to FIGS. 1–4.

Heat is conducted from or to devices 218 and 220, specifically from their respective integrated circuits 244 and 254, as shown in FIGS. 7 and 9, by use of paths including symbols having the appearance of resistors to denote thermal resistance. The following discussion relates to heat removal from the devices. Reference is also made to FIG. 10 which, like FIG. 5, illustrates that heat may be removed from or furnished to devices 218 and 220, as respectively depicted by downwardly and upwardly directed arrow heads.

Heat from device 218 (U1) is at its maximum at integrated circuit 244, denoted by $T_{jMAx-U1}$, and is conducted therefrom through matter in device 218, having a thermal resistance denoted by indicium 246, to a junction $T_{CASE-U1}$ (indicium 248) at the exterior or case of device 218. Thence, heat is conducted through potting material 229, having a thermal resistance denoted by indicium 250, through one or more vias 238b in printed wiring board 224b to a junction $T_{PWB}$ (indicium 262b), and thence to a junction $T_{COPPER-UPPER-SURFACE}$ (denoted by indicium 252) at cold wall plate lower surface 228b.

In a similar manner, heat from device 220 (U2) is at its maximum at integrated circuit 254, denoted by $T_{jMAX-U2}$, and is conducted therefrom through matter internal to device 220, having a thermal resistance denoted by indicium 256, to a junction $T_{CASE-U2}$ (denoted by indicium 258) to the exterior or case of device 220. Thence, heat is conducted through potting compound 225 having a thermal resistance denoted by indicium 260 through one or more vias 238a in printed wiring board 224a to a junction $T_{PWB}$ (indicium 262a). Heat energy is conducted therefrom through cold wall or plate 228 (denoted again by thermal resistance 266) to join the heat conductance path from device 218 at $T_{COPPER-UPPER-SURFACE}$ (denoted again by indicium 252) at cold wall plate lower surface 228b.

From junction point 252 at $T_{COPPER-UPPER-SURFACE}$, heat is then fed into the array of Peltier thermoelectric heat pumps 232 which produce a temperature drop of about 20° C. to 30° C. Heat energy travels from heat pumps 232 to a junction $T_{PELTIER\ HOT}$ (indicium 270) and into and through main heat sink 234 having a thermal resistance (indicium 272), for transfer to the exterior of environmentally protected module 216 through wedge-locks 236 at junction 274 ($T_{WEDGE}$). Final rejection of heat from module 216 and its supporting structure is denoted by a passage through module supporting external heat sink 235 having a thermal resistance denoted by indicium 276 and through a junction 278 to an external heat exchanger 280.

Like the embodiment described with respect to FIGS. 1–5, while heat pumps 232 have been described as functioning to extract heat from module 216 and its heat generating devices, they are also useful to inject heat in the module and its devices, should temperature conditions so require. Thus, this embodiment of the external heat exchanger also functions either as a heat sink for receiving heat from electronic components or devices 218 and 220, or for supplying heat to them.

TEST RESULTS

A module, such as depicted in FIGS. 1–5, was subjected to testing, and proved that the active heatsink makes it possible to use available high performance commercial parts reliably with no temperature prescreening. Briefly, tests showed that the Peltier pumps provided a controlled environment that buffers the temperature extremes seen by the commercial plastic encapsulated die. At temperatures below 20° C. the Peltier units pump heat into the electronics module. At temperatures above +40° C. the Peltier units pump heat out of the electronics module.

COMPUTER PROCESSING UNIT THERMAL DESCRIPTION

Use of a large number of Peltier devices reduces the thermal resistance between the load and the main heatsink. The cavity between the cold plate and electronics module was filled with a thermally conductive elastomer to reduce the thermal resistance between the individual electronic parts and the cold plate, and coupled their heat to the printed wiring board. It also acted as a moisture barrier, damped vibration, compensated for mechanical tolerance accumulation, and spread heat over a larger area of the cold plate. In the printed wiring board, the power and ground planes spread heat laterally. This allowed heat to be removed through the top and bottom surfaces of each integrated circuit package as well as through the leads. Parts on the opposite side of the printed wiring board not facing the cold plate were military or industrial rated since they do not receive the full benefit of the active heatsink. These parts may be coated with a thermally conductive elastomer to further buffer them from the environment.

Sixteen Peltier thermoelectric heat pumps were used so that at +15 vdc they conducted less than 500 madc at 80° C. Their coefficient of performance was 1.4 at this operating point, that is, they were able to pump 1.4 times 7.5 watts and maintain a temperature drop of 20° C. across each device. Each Peltier unit pumped 0.5 watt of load and contributed only 0.5 watt to do this. The operating point and number of devices was key to the active heatsink performance.

With +28 vdc applied to the Peltier array cathode to anode at -50° C., 1.7 amps provided 48 watts of heating under steady state conditions.

COMPUTER PROCESSING UNIT INSTRUMENTATION

The cavity between the active heatsink cold plate and the computer processing unit were not filled with a thermally conductive elastomer. A 0.02 inch thickness of Berquist GAP pad was placed over the cold plate. A one inch square 0.02 inch thick copper shim was installed between the computer processing unit die and the cold plate using a 256 ball grid array. A first thermocouple $T_{cpu}$ was bonded at location 82 (FIG. 3) to integrated circuit 44 of component 18 (U1) to monitor the computer processing unit junction temperature. A second thermocouple $T_{hsk}$ at location 84 (FIGS. 2, 4 and 4a) was bonded to the center of the main aluminum heat sink to monitor its maximum temperature. A third thermocouple $T_{wall}$ at location 86 (FIGS. 3 and 4) was embedded in one of the massive aluminum heatsinks supporting the computer processing unit module. Thermocouple $T_{wall}$ was 0.020 inch from the computer processing unit rib and half way between the connector and module ejector. A fourth thermocouple $T_{chmb}$ at location 88 (FIG. 3) outside of exterior heat sink 35 was used to monitor the chamber temperature. The cavity temperature was monitored by a temperature controller, in turn, monitored by a solid state integrated circuit, on the active heatsink $T_{case}$ at location 90 (FIG. 3). The computer processing unit printed wiring board not facing the cold plate was monitored by another temperature controller on surface $T_{pwb}$ at location 92 (FIG. 3). The computer processing unit was shielded from air currents inside the chamber with antistatic bubble wrap.

COMPUTER PROCESSING UNIT THERMAL DATA

Figure 11:
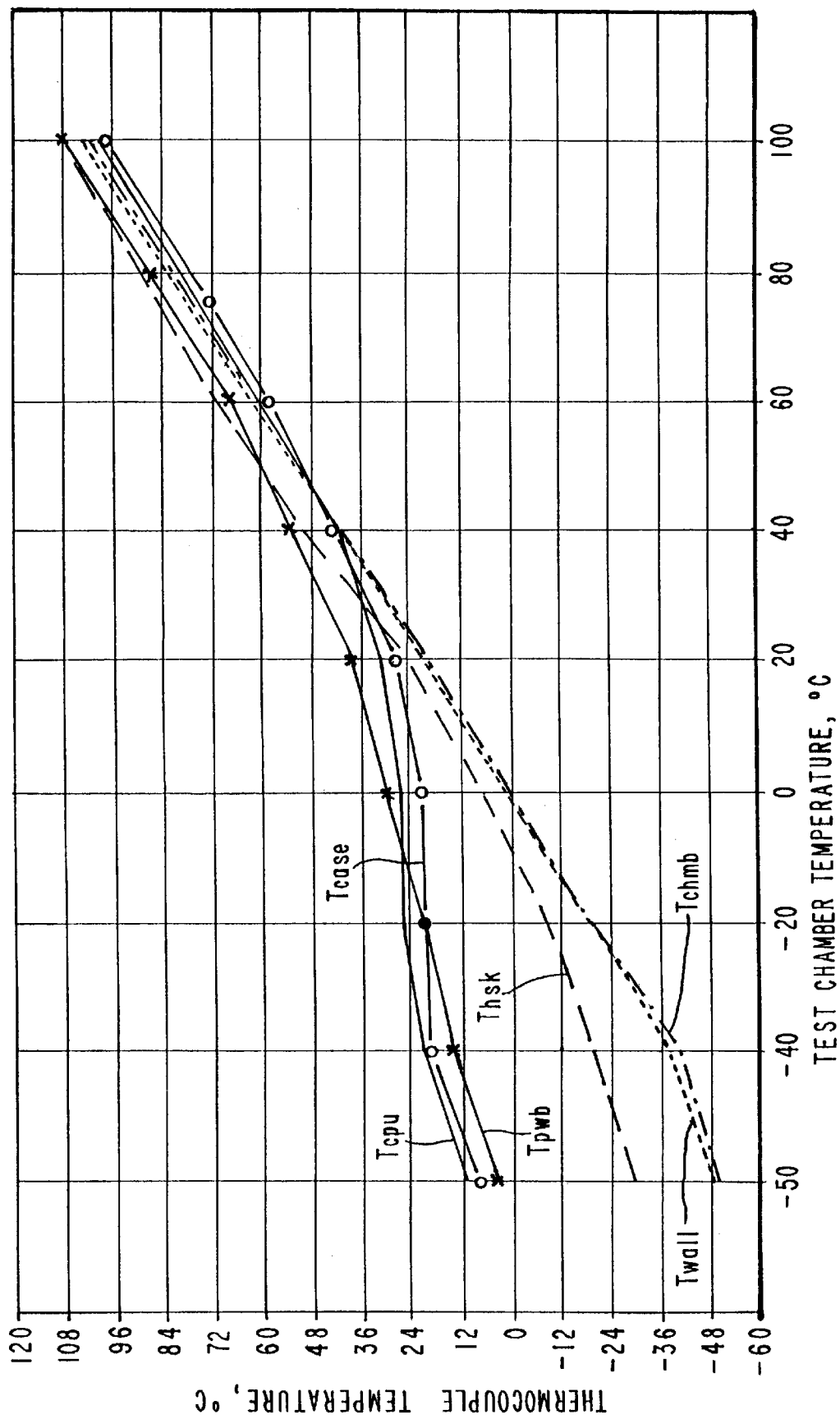
FIGS. 11–13 graphically depict the temperature data set forth in Tables I and II below, respectively showing thermal profile test results and differences between selected ones of the results of a computer processing unit module placed in a test chamber. The temperature data are taken from six selected points or locations in, on and surrounding the module, and are denoted $T_{cpu}$, $T_{hsk}$, $T_{wall}$, $T_{chmb}$, $T_{case}$, $T_{pwb}$, in which "cpu" =computer processing unit, "hsk" =heat sink, "wall" =finned heatsink, "chmb" =a closed chamber surrounding the module, "case" =component exterior casing, and "pwb" =printed wiring board. The data are further compared with nine different test chamber temperatures surrounding the module for temperatures ranging from −50° C. to 100° C.
Figure 12:
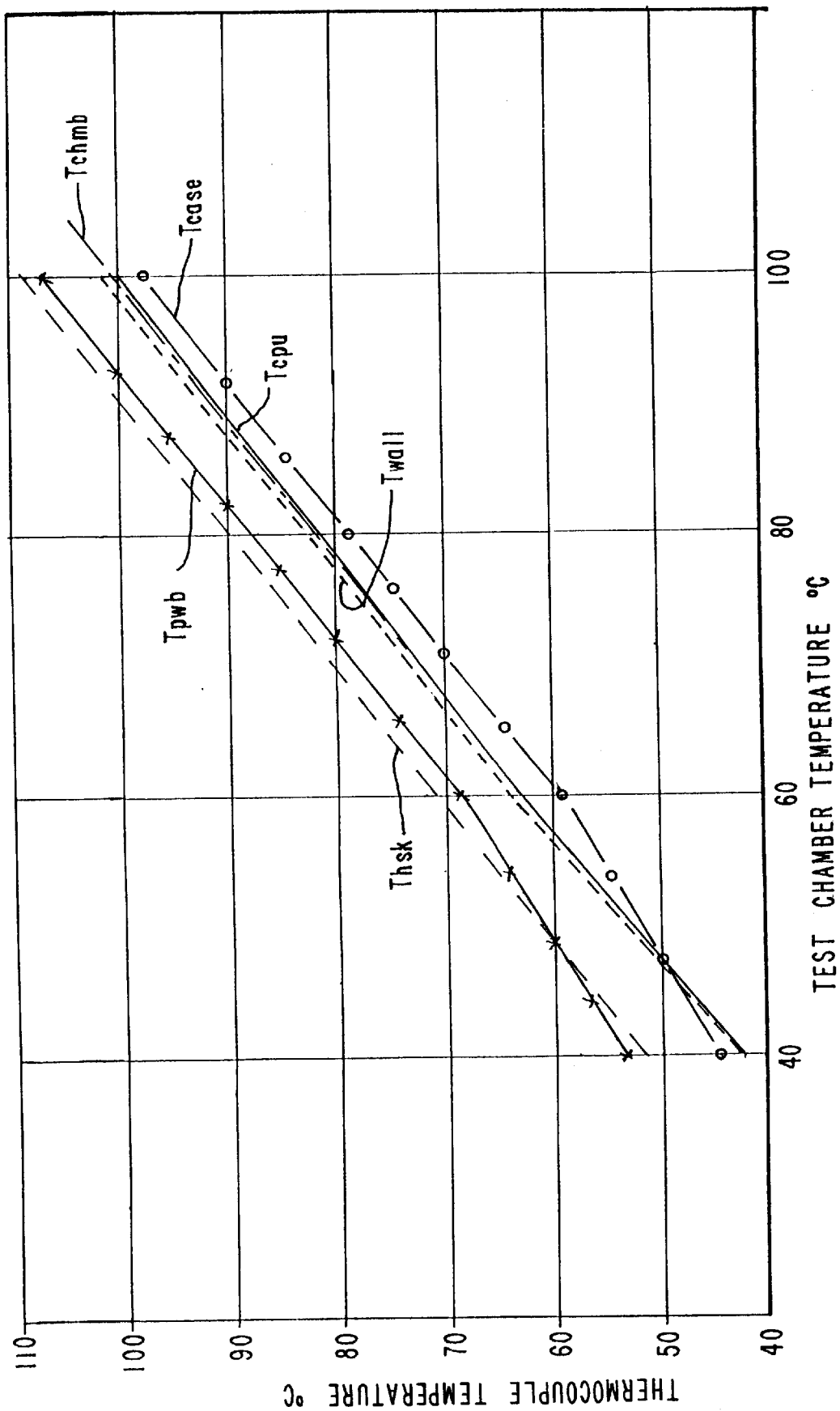
Figure 13:
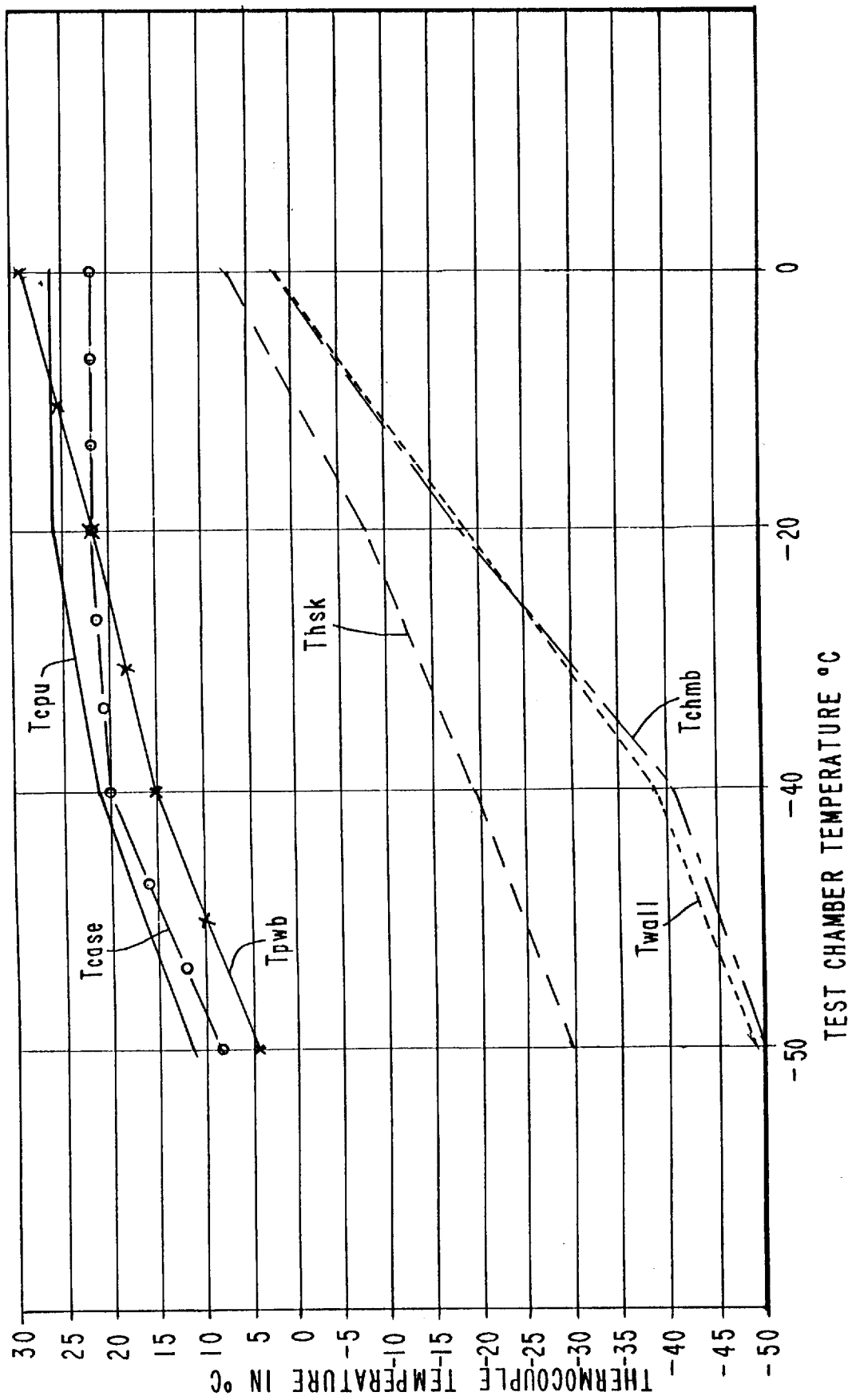

FIG. 3 shows the instrumented computer processing unit installed in its supporting aluminum heatsinks. Power was provided with a break out box located outside the chamber. A dumb CRT terminal outside the chamber was connected to the computer processing unit module to monitor successful execution of a test program. A test program, residing in the FLASH memory on the computer processing unit module, was copied to DRAM memory to write and read various 64 bit patterns from the 32 megabyte DRAM memory on the computer processing unit module. TABLE I is a record of the all thermocouple readings. The powered module was soaked at each chamber temperature for 25 minutes, and then allowed to operate for 10 minutes while monitoring for failures. The chamber was allowed to stabilize at 20° C. for 30 minutes with no power to the module. All six thermocouples indicated 20° C. verifying the instrumentation calibration and accuracy at one point. The chamber was then ramped to the next temperature. The computer processing unit module dissipated 8.3 watts. The active heatsink dissipated 7.14 watts at 80° C. At no time did the computer processing unit fail any diagnostic test. The raw data recorded is presented in TABLE I below, and shown graphically in FIG. 11 for operation over the -50° C. to +100° C. range. FIG. 12 graphically shows hot operation over the +40° C. to +100° C. range. FIG. 13 graphically shows cold operation over the -50° C. to 0° C. range.

TABLE I

| Test Chamber Temperature °C. | -50 | -40 | -20 | 0 | 20 | 40 | 60 | 80 | 100 |
|---|---|---|---|---|---|---|---|---|---|
| $T_{cpu}$ | 11 | 21 | 26 | 26 | 31 | 42 | 62 | 81 | 100 |
| $T_{hsk}$ | -30 | -20 | -8 | 7 | 25 | 51 | 71 | 90 | 109 |
| $T_{wall}$ | -49 | -39 | -19 | 2 | 22 | 42 | 62 | 82 | 102 |
| $T_{chmb}$ | -50 | -41 | -19 | 1 | 20 | 42 | 62 | 81 | 101 |
| $T_{case}$ | 8 | 20 | 22 | 22 | 27 | 44 | 59 | 80 | 99 |
| $T_{pwb}$ | 4 | 15 | 22 | 29 | 38 | 53 | 69 | 89 | 108 |

To understand fully all these data points, three operating regions are examined in detail. The first region is at a chamber temperature of 20° C. where the active heatsink was "OFF" all the time. The second region is at a chamber temperature of 60° C. where the active heatsink was "ON" all the time in the cooling mode, and a third region at -40° C. where the active heatsink was "ON" all the time in the heating mode.

OPERATION AT 20° C.

At 20° C. the active heatsink is a passive thermal resistance. All readings were held stable for 25 minutes to obtain accurate data. The chamber temperature was 20° C. The chamber wall comprised two four pound, eight inch by eight inch finned aluminum heatsinks clamped to module 16 by its wedge-locks 36. The wall temperature was 21° C. only 1° C. above the chamber temperature. This data verified that the thermal resistance of the heatsinks was very low and that the heatsinks are representative of an actual enclosure. The heatsink maximum temperature was 25° C., or 5° C. above the wall, thus indicating that the thermal resistance (R) of the combined main heatsink and wedge-lock was:

$R_{hsk\_wall}$=5° C./8.3 watts $R_{hsk\_wall}$=0.6° C. per watt

The temperature rise of $T_{case}$ to $T_{hsk}$ through the Peltier array was only 2° C., as follows:

$T_{case}-T_{hsk}$=27° C.-25° C.

$T_{case}-T_{hsk}$=2° C.

The temperature rise of $T_{pwb}$ to $T_{case}$ through the printed wiring board, the electronic parts on the bottom of the printed wiring board facing the cold plate, and the 0.02 inch GAP pad filler that thermally connects the load to the cold plate was:

$T_{pwb}-T_{case}$=38° C.-27° C.

$T_{pwb}-T_{case}$=11° C.

The temperature rise of $T_{cpu}$ to $T_{case}$ is from the computer processing unit junction through the copper shim and the 0.02 inch GAP pad filler to the cold plate. Heat also flowed away from the computer processing unit junction through the ceramic package through a solder ball connection on the ball grid array package to the power and ground planes underneath. This temperature difference was:

$T_{cpu-Tcase}$=31° C.-27° C.

$T_{cpu-Tcase}$=4° C.

This result points out a strong advantage of the thermal design, namely that the temperature rise to the junction of the highest power part is lower than the rise from the printed wiring board to cold plate rise shown above. Although the computer processing unit was placed close to the wedge-lock rib, the active heatsink was not providing any cooling at all.

Overall, the temperature rise from the computer processing unit junction to the wall was:

$T_{cpu} - T_{wall} = 31°$ C.$-20°$ C.
$T_{cpu} - T_{wall} = 11°$ C.

while the case temperature rise of passive parts facing the cold plate was:

$T_{case} - T_{wall} = 27°$ C.$-20°$ C.
$T_{case} - T_{wall} = 7°$ C.

and while the case temperatures of passive parts not facing the cold plate was:

$T_{pwb} - T_{wall} = 38°$ C.$-20°$ C.
$T_{pwb} - T_{wall} = 18°$ C.

All these temperature deltas are recorded in TABLE II.

OPERATION AT 60° C.

At 60° C. the active heatsink was "ON" 100 percent of the time. All readings had been stable for 25 minutes to obtain accurate data. The chamber temperature was 60° C. The wall temperature was 62° C., only 2° C. above the chamber temperature. The heatsink maximum temperature was 71° C., 9° C. above the wall, indicating the thermal resistance of the main heatsink and wedge-lock combined was:

$R_{hsk\_wall} = 9°$ C./8.3 watts 7.5 watts
$R_{hsk\_wall} = 0.56°$ C. per watt

The temperature rise $T_{case}$ to $T_{hsk}$ through the Peltier array and was minus 12° C., to wit:

$T_{case} - T_{hsk} = 59°$ C.$-71°$ C.
$T_{case} - T_{hsk} = -12°$ C.

The temperature rise $T_{pwb}$ to $T_{case}$ through the printed wiring board, the electronic parts on the bottom of the printed wiring board facing the cold plate, and the 0.02 inch GAP pad filler that thermally connects the load to the cold plate was still:

$T_{pwb-Tcase} = 69°$ C.$-59°$ C.
$T_{pwb-Tcase} = 10°$ C.

The temperature rise $T_{cpu}$ to $T_{case}$ was from the computer processing unit junction through the copper shim and the 0.02 inch GAP pad filler to the cold plate. Heat also flowed away from the computer processing unit junction through the ceramic package and the solder ball connection on the ball grid array package to the power and ground planes underneath. This temperature difference was still:

$T_{cpu} - T_{case} = 62°$ C.$-59°$ C.
$T_{cpu} - T_{case} = 3°$ C.

Overall, the temperature rise from computer processing unit junction to the wall was:

$T_{cpu} - T_{wall} = 62°$ C.$-62°$ C.
$T_{cpu} - T_{wall} = 0°$ C.

The case temperature rise of passive parts facing the cold plate was:

$T_{case} - T_{wall} = 59°$ C.$-62°$ C.
$T_{case} - T_{wall} = -3°$ C.

The case temperatures of passive parts not facing the cold plate was:

$T_{pwb} - T_{wall} = 69°$ C.$-62°$ C.
$T_{pwb} - T_{wall} = 7°$ C.

Figure 14:
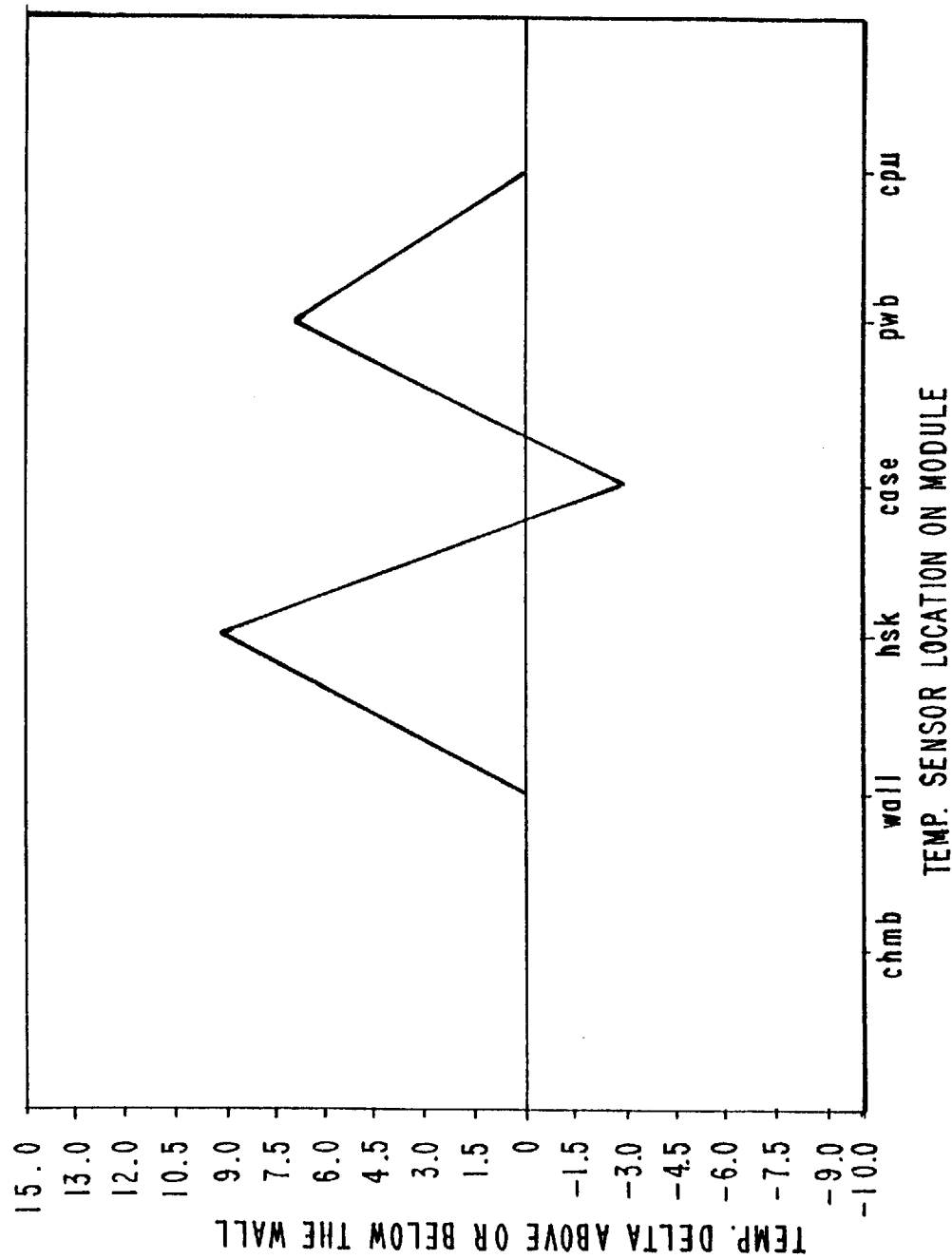
FIG. 14 graphically represents the data set forth in Table II below comparing differences in temperature taken in FIGS. 11–13 between pairs of the 6 selected points or locations in, on and surrounding the module.

All these temperature deltas are recorded in TABLE II and plotted in FIG. 14.

OPERATION AT −40° C.

At −40° C. the active heatsink was "ON" 100 percent of the time in the heating mode. All readings were stable for 25 minutes to obtain accurate data. The chamber temperature was −40° C. The wall temperature was −39° C., only 2° C. below the chamber temperature. The heatsink maximum temperature was −19° C. above the wall. The temperature rise $T_{case}$ to $T_{hsk}$ through the Peltier array was 40° C.

$T_{case} - T_{hsk} = 20°$ C.$--20°$ C.
$T_{case} - T_{hsk} = 40°$ C.

The temperature rise $T_{pwb}$ to $T_{case}$ through the printed wiring board, the electronic parts on the bottom of the printed wiring board facing the cold plate, and the 0.02 inch GAP pad filler that thermally connects the load to the cold plate was:

$T_{pwb} - T_{case} = 15°$ C.$-20°$ C.
$T_{pwb} - T_{case} = -5°$ C.

The temperature rise $T_{cpu}$ to $T_{case}$ was from the computer processing unit junction through the copper shim and the 0.02 inch GAP pad filler to the cold plate. Heat also flowed away from the computer processing unit junction through the ceramic package through the 255 solder ball connection on the BGA package to the power and ground planes underneath. This temperature difference was still:

$T_{cpu} - T_{case} = 21°$ C.$-20°$ C.
$T_{cpu} - T_{case} = 1°$ C.

Overall, the temperature rise from computer processing unit junction to the wall was:

$T_{cpu} - T_{wall} = 21°$ C.$--39°$ C.
$T_{cpu} - T_{wall} = 60°$ C.

The case temperature rise of passive parts facing the cold plate was:

$T_{case} - T_{wall} = 20°$ C.$-39°$ C.
$T_{case} = T_{wall} = 59°$ C.

The case temperatures of passive parts not facing the cold plate was:

$T_{pwb} - T_{wall} = 15°$ C.$--39°$ C.
$T_{pwb} - T_{wall} = 54°$ C.

All these temperature deltas are recorded in TABLE II. FIG. 14 provides a more intuitive look at the operation of the module at 40° C. and above.

TABLE II

| Test Chamber Temperature °C. | −50 | −40 | −20 | 0 | 20 | 40 | 60 | 80 | 100 |
|---|---|---|---|---|---|---|---|---|---|
| $T_{cpu} - T_{wall}$ | 60 | 60 | 45 | 24 | 9 | 0 | 0 | −1 | −2 |
| $T_{hsk} - T_{wall}$ | 19 | 19 | 27 | 5 | 3 | 9 | 9 | 8 | 7 |
| $T_{wall} - T_{wall}$ | 0 | 0 | 0 | 0 | 0 | 0 | 0 | 0 | 0 |
| $T_{chmb} - T_{wall}$ | −1 | −2 | 0 | −1 | −1 | 0 | 0 | −1 | −1 |
| $T_{case} - T_{wall}$ | 57 | 59 | 41 | 20 | 5 | 2 | −3 | −2 | −3 |
| $T_{pwb} - T_{wall}$ | 53 | 54 | 41 | 27 | 16 | 11 | 7 | 7 | 6 |

FIG. 14 clearly shows the effects of Peltier cooling. The heatsink maximum temperature of 9° C. was higher than a conventional module because the 8.3 watts load plus the 7.5 watts generated by the Peltier pumps was flowing into the 0.6° C. per watt thermal resistance of the heatsink/wedge-lock thermal resistance. The 12° C. drop to the case is the result of the Peltier's cooling effect. The temperature sensor on the active heatsink was not in direct contact with the Peltier cold side and there were thermal losses through the epoxy film bonding the Peltier units to the copper cold plate; thus, it was not possible to monitor the delta drop in temperature across the Peltier arrays directly. The temperature of passive parts in the cavity between the cold plate and the top of the printed wiring board ranged between −3° C. and +7° C. The printed wiring board temperature rise was recorded by an integrated circuit (IC) mounted on the top of the printed wiring board which was not tightly coupled to the cavity temperature.

Of particular interest in FIG. 14 is the computer processing unit junction temperature. It equal to the wedge-lock temperature because the computer processing unit junction was thermally very tightly coupled to the cold plate, and physically it was very close to the cold plate.

In comparison with a prior art computer processing unit employing a conventional aluminum cored printed wiring board, the junction temperature was 25° C. to 35° C. above the wall or wedge-lock temperature.

Although the invention has been described with respect to particular embodiments thereof, it should be realized that various changes and modifications may be made therein without departing from the spirit and scope of the invention.

What is claimed is:

1. An environmentally protected module qualifiable under military specifications using commercial and industrial grade electronic components, comprising:

thermoelectric heat pump apparatus coupled to an external heat exchanger;

commercial and industrial grade electronic components electrically coupled together to perform an electronic function and each thermally coupled to said thermoelectric heat pump apparatus by thermally conductive vias; and thermally conductive and electrically insulative packaging material encapsulating said components and providing, with said vias, a thermally conductive coupling between said components and said thermoelectric heat pump apparatus.

2. An environmentally protected module according to claim 1 in which said thermoelectric heat pump apparatus comprises Peltier devices for enabling heat to be conducted selectively to and from said commercial and industrial grade electronic components.

3. An environmentally protected module according to claim 2 further comprising:

a thermally conductive and electrically insulative cold plate in thermal coupling with said Peltier devices and said commercial and industrial grade electronic components; and a support supporting said Peltier devices for enabling said Peltier devices to be positioned in thermal coupling with the external heat exchanger.

4. An environmentally protected module according to claim 3 in which said printed wiring board arrangement includes a single printed wiring board, and said thermally conductive encapsulating packaging material is thermally coupled to said Peltier devices.

5. An environmentally protected module qualifiable under military specifications using commercial and industrial grade electronic components, comprising:

thermoelectric heat pump apparatus coupled to an external heat exchanger;

commercial and industrial grade electronic components electrically coupled together to perform an electronic function and thermally coupled to said thermoelectric heat pump apparatus;

thermally conductive and electrically insulative packaging material encapsulating said components and providing a thermally conductive coupling between said components and said thermoelectric heat pump apparatus; and an arrangement including at least one printed wiring board having thermally conductive vias extending therethrough and providing, with said thermally conductive encapsulating packaging material, said thermally conductive coupling between said components and said thermoelectric heat pump apparatus.

6. An environmentally protected module according to claim 5 in which said thermoelectric heat pump apparatus comprises Peltier devices for enabling heat to be conducted selectively to and from said commercial and industrial grade electronic components.

7. An environmentally protected module according to claim 6 in which said printed wiring board arrangement includes a single printed wiring board, and further comprising:

a heat sink thermally coupled to the external heat exchanger;

a thermally conductive cold plate positioned between and spaced from said heat sink and said printed wiring board;

a board supporting said Peltier devices in an array that enables said Peltier devices to be positioned in thermal contact with both said heat sink and said cold plate; and a cover spaced from said printed wiring board, said encapsulating packaging material being positioned between said printed wiring board and said cold plate and between said printed wiring board and said Peltier supporting board.

8. An environmentally protected module according to claim 7 further comprising spacers separating said cover, said printed wiring board and said cold plate from one another, for enclosing said encapsulating packaging material between said cover and said printed wiring board and between said printed wiring board and said cold plate.

9. An environmentally protected module according to claim 6 further comprising:

a thermally conductive and electrically insulative cold plate in thermal coupling with said Peltier devices and said commercial and industrial grade electronic components; and a support supporting said Peltier devices for enabling said Peltier devices to be positioned in thermal coupling with the external heat exchanger.

10. An environmentally protected module according to claim 9 in which said printed wiring board arrangement includes a single printed wiring board, in which said thermally conductive encapsulating packaging material is thermally coupled to said Peltier devices.

11. An environmentally protected module according to claim 10 further comprising thermally conductive vias extending through said printed wiring boards and providing, with said thermally conductive encapsulating packaging material, said thermally conductive coupling between said components and said thermoelectric heat pump apparatus.

12. An environmentally protected module according to claim 9 in which said printed wiring board arrangement includes a pair of printed wiring boards, and further comprising:

thermally conductive vias extending through said printed wiring boards and providing, with said thermally conductive encapsulating packaging material, said thermally conductive coupling between said components and said thermoelectric heat pump apparatus;

a thermally conductive and electrically insulative cold plate sandwiched between said printed wiring boards in thermal coupling with said Peltier devices and said commercial and industrial grade electronic components;

a support supporting said Peltier devices for enabling said Peltier devices to be positioned in thermal contact with the external heat exchanger.

13. An environmentally protected module according to claim 1 in which said thermoelectric heat pump apparatus comprises Peltier devices for enabling heat to be conducted selectively to and from said commercial and industrial grade electronic components further comprising:

a thermally conductive and electrically insulative cold plate;

a support supporting said Peltier devices for enabling said Peltier devices to be positioned in thermal coupling with both said cold plate and the external heat exchanger.

14. An environmentally protected module comprising commercial and industrial grade components, thermally conductive material encapsulatingly said components to secure said components within an environmentally protected enclosure, thermo-electric heat pump apparatus having a thermal coupling between an external heat exchanger and said components, said thermal coupling including providing, in addition to said thermally conducting material, thermally conductive vias coupled to and between said components and said heat pump apparatus.

15. An environmentally protected module comprising commercial and industrial grade components, thermally conductive material placed about said components to secure said components within an environmentally protected enclosure, thermoelectric heat pump apparatus thermally coupled between an external heat exchanger and said components; a printed wiring board supporting and electrically coupling said components together, and thermally conductive vias extending through said printed wiring board and providing, with said thermally conductive packaging material, said thermally conductive coupling between said components and said thermoelectric heat pump apparatus.

16. A module according to claim 15 in which said components and said printed wiring board are encapsulated within said thermally conductive packaging material.

17. A method for environmentally protecting an electronic module using commercial and industrial grade components, comprising the step of thermally coupling thermoelectric heat pump apparatus between an external heat exchanger and the components, said thermally coupling step including the steps of providing thermally conducting and electrically insulating packaging material encapsulating said components, and additionally providing thermally conductive vies coupled to and between the components and the heat pump apparatus.

18. A method for environmentally protecting an electronic module using commercial and industrial grade components, comprising the steps of enclosing the components in thermally conductive and environmentally protective material, thermally coupling thermoelectric heat pump apparatus between an external heat exchanger and the components, supporting and electrically coupling the components together on a printed wiring board, and extending thermally conductive vias through the printed wiring board to provide, with the thermally conductive enclosing material, the thermally conductive coupling between the components and the thermoelectric heat pump apparatus.

19. A method according to claim 18 further in which said enclosing step comprises the step of encapsulating the components and the printed wiring board within the thermally conductive packaging material.

* * * * *